United States Patent
Vonroth

(10) Patent No.: US 9,604,514 B2
(45) Date of Patent: Mar. 28, 2017

(54) ELECTRICAL SUPPLY ARRANGEMENT ON A VEHICLE

(71) Applicant: AGCO International GmbH, Neuhausen am Rheinfall (CH)

(72) Inventor: Daniel Vonroth, Betzigau (DE)

(73) Assignee: AGCO International GmbH, Neuhausen (CH)

(*) Notice: Subject to any disclaimer, the term of this patent is extended or adjusted under 35 U.S.C. 154(b) by 491 days.

(21) Appl. No.: 14/355,621

(22) PCT Filed: Oct. 9, 2012

(86) PCT No.: PCT/EP2012/069969
§ 371 (c)(1),
(2) Date: May 1, 2014

(87) PCT Pub. No.: WO2013/068192
PCT Pub. Date: May 16, 2013

(65) Prior Publication Data
US 2014/0285000 A1    Sep. 25, 2014

(30) Foreign Application Priority Data
Nov. 10, 2011    (GB) .................................. 1119368.7

(51) Int. Cl.
*A01B 59/00* (2006.01)
*A01B 59/06* (2006.01)
(Continued)

(52) U.S. Cl.
CPC ................ *B60D 1/64* (2013.01); *A01B 59/00* (2013.01); *A01B 59/06* (2013.01); *B60D 1/62* (2013.01);
(Continued)

(58) Field of Classification Search
CPC .......... A01B 59/00; A01B 59/06; B60D 1/62; B60D 1/64; B60R 16/02; B60R 16/03;
(Continued)

(56) References Cited

U.S. PATENT DOCUMENTS

| 4,897,642 A * | 1/1990 | DiLullo ................ B60R 25/102 235/385 |
| 2005/0212665 A1 | 9/2005 | Flohr |

(Continued)

FOREIGN PATENT DOCUMENTS

| GB | 2017432 A | 10/1979 |
| GB | 2399467 A | 9/2004 |
| WO | WO 2012/010489 A1 | 1/2012 |

OTHER PUBLICATIONS

UK Search Report for Application No. GB1119368.7 dated Feb. 16, 2012.
(Continued)

*Primary Examiner* — Levi Gannon

(57) ABSTRACT

An electrical connection arrangement on a vehicle comprising vehicle contact means connectable to an implement contact means associated with an implement. The vehicle and/or implement contact means is connectable to a control unit which determines wear or damage of the vehicle and/or implement contact means and the wear or damage is communicated to the vehicle operator.

12 Claims, 1 Drawing Sheet

(51) Int. Cl.
*B60D 1/64* (2006.01)
*B60R 16/03* (2006.01)
*G01R 31/04* (2006.01)
*G01R 31/02* (2006.01)
*B60D 1/62* (2006.01)

(52) U.S. Cl.
CPC ............ *B60R 16/03* (2013.01); *G01R 31/021* (2013.01); *G01R 31/026* (2013.01); *G01R 31/04* (2013.01)

(58) Field of Classification Search
CPC .... G01R 31/02; G01R 31/021; G01R 31/024; G01R 31/026; G01R 31/04
USPC .......................................................... 307/9.1
See application file for complete search history.

(56) References Cited

U.S. PATENT DOCUMENTS

| | | |
|---|---|---|
| 2009/0305519 A1 | 12/2009 | Tarasinski |
| 2010/0308559 A1 | 12/2010 | Tarasinski et al. |
| 2011/0204712 A1 | 8/2011 | Tarasinski et al. |

OTHER PUBLICATIONS

International Search Report for International Application No. PCT/EP2012/069969 dated Feb. 28, 2013.

\* cited by examiner

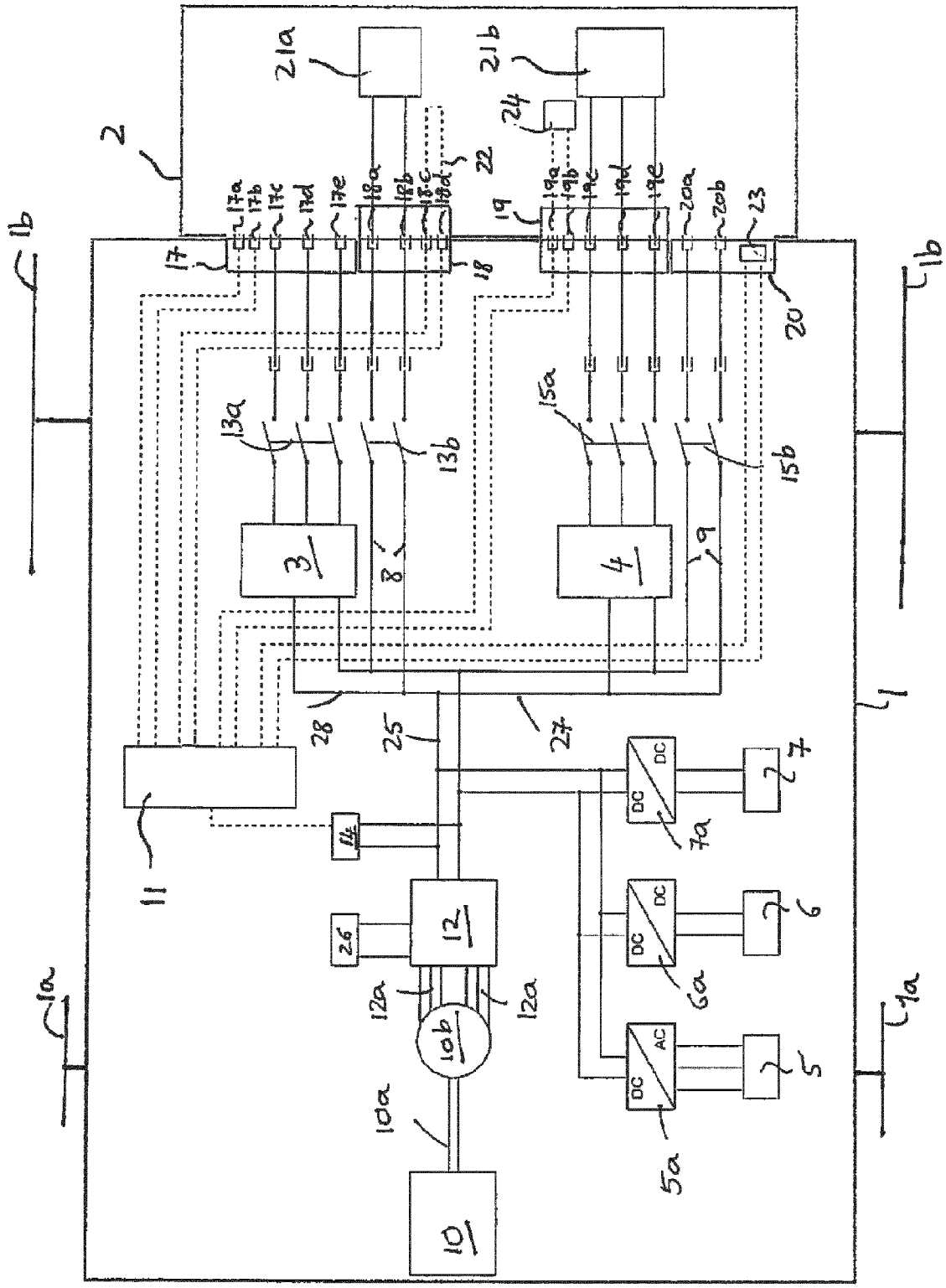

ELECTRICAL SUPPLY ARRANGEMENT ON A VEHICLE

This invention relates to an electrical connection arrangement on a vehicle and/or an implement attachable to the vehicle to alert the operator when the contact means of the arrangement is worn or damaged. More specifically, the invention relate to an electrical connection arrangement on an agricultural vehicle and/or an implement attachable to the agricultural vehicle.

Typically, agricultural vehicles have an internal DC voltage network (12V or 24 V) for supplying vehicle components and external systems, such as lights, or control units on an attached implement. The power output of these networks is very small (less than 2 kW).

Agricultural vehicles, such as agricultural tractors differ considerably from trucks, vans and passenger cars as their primary requirement is not to simply drive over the ground but to operate and power attached implements, such as trailers, balers, seed drills, ploughs, and front loaders. On agricultural machines, harvesting headers may be attached. Therefore, in the following description, the term implement is used to mean all types of equipment or apparatus which may be attached to an agricultural vehicle or agricultural machine.

These implements may be powered by a Power Take Off (PTO) shaft driven from an engine of the agricultural vehicle, or by a hydraulic circuit on the agricultural vehicle. This way the drives of the implement are powered. These drives must be very powerful, and therefore the supplied power is often in the range 20 kW to 100 kW.

Instead of the supply of power to an implement by a PTO, or hydraulic circuit, a tractor may be equipped with AC or DC electrical networks, which are capable of delivering a voltage greater than 400 V. These so called medium voltage networks require improved safety measures to avoid damage to the vehicle, implement and operator.

Agricultural vehicles are provided with connection means at the rear, and/or front of the vehicle which are connected to the internal medium voltage network. An implement is also provided with an implement contact means which can be connected to the vehicle contact means to power the implement.

During usage of the tractor, various implement contact means are connected and re-connected to the vehicle contact means. This wears and/or damages the contact means on both the vehicle and implement which increases the resistance of the contact means and thus decreases the efficiency of the network. There is also the risk of an electric shock to the operator should a fault develop when the operator is nearby.

It is an aim of the present invention to provide an electrical connection arrangement which notifies the operator when the vehicle and/or implement contact means is worn or damaged to overcome the aforementioned problems.

According to the invention there is provided an electrical connection arrangement on a vehicle comprising vehicle contact means connectable to an implement contact means associated with an implement, wherein said vehicle and/or implement contact means is connectable to a control unit which determines wear or damage of the vehicle and/or implement contact means and the wear or damage is communicated to the vehicle operator.

The control unit may be installed on the vehicle or the implement.

Preferably, the control unit counts and displays the number of times the vehicle and/or implement contact means are re-connected.

More preferably, the control unit notifies the operator of wear or damage when a pre-determined number of re-connections is reached.

Preferably the control unit indicates whether the vehicle and/or implement contact means is connected or not.

The vehicle contact means may be connectable to an electronic Bus system of an implement and the control unit is sent a signal if the implement is connected.

The Bus system may be, for example an ISOBUS, FIELDBUS or Ethernet system.

The vehicle or implement contact means and the control unit may form an open circuit when an implement contact means is disconnected and a closed circuit with the implement contact means is connected.

In this way the control unit may measure the resistance of the circuits and determine whether the vehicle contact means is connected or not.

Alternatively or additionally, the control unit may be connected to a temperature sensor which senses the temperature of the vehicle and/or implement contact means allowing the control unit to determine the resistance across the corresponding contact means and therefore whether that contact means is connected or not.

Alternatively, or additionally the control unit may be connected to an insulation monitor which compares a current applied to the vehicle contact means to the actual current flowing across the contact means and therefore determines whether an implement is attached to the vehicle contact means or not.

Preferably, the wear or damage of the vehicle and/or implement means is determined by measuring the temperature or resistance of the vehicle and/or implement contact means.

In a further alternative arrangement, the temperature or resistance of the implement contact means is measured and sent to an implement control unit and the implement control unit is connected to the vehicle control unit which notifies the operator of wear/and or damage of the implement contact means.

The invention will now be described, by way of example only, with reference to FIG. 1 which is a diagrammatic scheme of an electric supply arrangement of a vehicle in accordance with the invention.

FIG. 1 shows an electric supply arrangement circuit for an agricultural tractor 1 having front wheels 1a and rear wheels 1b. The tractor 1 is connected to an implement 2 at its rear, such as a plough or trailer.

Use of the term agricultural vehicle herein includes those vehicles which may also be described as self propelled agricultural machines such as combine harvesters and forage harvesters, as well as agricultural vehicles, such as tractors.

The arrangement has a combustion engine 10, an electric generator 10b driven by the engine crank shaft 10a and an electronic power unit 12 (insulated gate bi-polar transistor) connected to the electric generator by wiring 12a. The generator produces AC power with an AC frequency dependent on the AC power output of the generator 10b which is transformed by means of the electronic power unit 12 to a DC voltage with the defined DC link voltage level to provide all units connected to DC network 25.

A brake chopper 26 is provided to avoid a voltage rise in the DC network 25 if energy is fed back into the system from sources other than the generator. The chopper comprises an oscillating switch in series with a resistor. Depending on the input voltage overshoot (coming from the implement, for example via the internal network) the switch oscillates to guide the excess voltage into the resistor transforming the voltage into heat. The oscillation is necessary to keep the network active and supplying energy. If the switch was to be closed completely over a longer period, the complete voltage supplied by the system would be converted to heat and all consumers would be non operative. By oscillating the switch, only the peaks of the voltage are converted to heat and the system is still operative. In addition, the resistors are generally designed to be quite small so they are not capable of receiving a constant high load. Using oscillation enables them to cope with the load. For example, the nominal voltage of the network is 700 V. The overshoot limitation is 900 V. If peaks of greater than 900 V occur, the switch is closed in an oscillatory manner.

An insulation monitoring system 14 is provided to monitor the resistance in the network to detect electrical malfunctions in the medium voltage system. This is necessary to protect the life of potential users of the system and to prevent damage in electric components of the tractor or implement or other consumers connected to the system.

An internal medium voltage DC network 25, that is one which can supply greater than 400V, 150 kW is provided. Such a network supplies tractor components such as a battery/supply network 7 via a DC/DC converter 7a to reduce voltages greater than 400 V to, for example, the standard 12V supply.

An electronic unit 6 for supplying a heating/ventilating/air conditioning (HVAC) compressor 6 via DC/DC converter 6a is also provided. Similarly a variable cooling fan drive 5 is supplied via a DC/AC inverter 5a to provide a variable frequency to vary fan speed.

To supply external consumers, such as consumers on implements attached to the tractor 1 an additional supply means is provided.

As shown in FIG. 1, a first DC/AC branch 28 of the tractor's electrical network supplies AC outlet terminal 17 and DC outlet terminal 18 in parallel. AC outlet terminal 17 comprises contact means 17a, 17b, 17c, 17d, 17e of which only contact means 17c, 17d and 17e are provided for AC medium voltage supply. Contact means 17a and 17b are provided to monitor the connection between tractor 1 and implement 2 and are described in detail further on.

Contact means 17c, 17d and 17e of the AC outlet terminal 17 are supplied by an electronic unit 3 and a power switch 13a. Electronic unit 3 is provided for inverting high power DC into three-phase high power AC at fixed frequency to supply electric motors or other electronic devices on an attached implement 2.

Power switch 13a can deactivate the vehicle connection means 17c to 17e and is controlled by control unit 11. Control unit 11 may be integrated into the tractor control unit on the tractor or integrated into the control unit of the electric supply system. Control unit 11 is connected to insulation monitoring system 14 and other components of the electric network. In case of an unintentional operating condition of the electric network, power switch 13b can cut the connection to contact means 17c, 17d and 17e to avoid damage to the tractor, implement, or operator.

Similar to AC outlet terminal 17, DC outlet terminal 18 comprises contact means 18a, 18b, 18c, 18. Only contact means 18a, 18b are provided for DC medium voltage supply. Contact means 18c and 18d are provided to monitor the connection between tractor 1 and implement 2 and are described in detail later.

Contact means 18a, 18b are directly connected to the DC network 25 via branch 8 and power switch 13b. In case there is unintentional operation of the electrical network, power switch 13b can cut the connection to contact means 18a, 18b to avoid damage to the tractor 1, implement 2, or operator.

Contact means 17a, 17b, 18c and 18d are not connected to the DC/AC branch. Instead they are connected to the control unit 11 as shown by the dotted lines.

Similar to first AC/DC branch 28, a second AC/DC branch 27 supplies AC outlet terminal 19 and DC outlet terminal 20 in parallel.

Identical to AC outlet terminal 17, AC outlet terminal 19 comprises contact means 19a, 19b, 19c, 19d, 19. Only contact means 19c, 19d and 19e are provided for AC medium voltage supply. Contact means 19a and 19b are provided to monitor the connection between tractor 1 and implement 2 and are described in detail later.

Contact means 19c, 19d and 19e of the AC outlet terminal 19 are supplied by an electronic unit 4 and a power switch 15a. Electronic unit 4 is provided to invert high power DC into three-phase high power AC at a fixed frequency to supply electric motors or other electronic devices on an attached implement 2.

Power switch 15a can deactivate the vehicle connection means 19c to 19e and is controlled by control unit 11. In case of unintentional operation of the electric network, power switch 15a can cut the connection to contact means 19c, 19d and 19e and thus avoid damage to the tractor 1, implement 2, or operator.

DC outlet terminal 20 comprises contact means 20a, 20b for DC medium voltage supply. Different to DC outlet terminal 18, a temperature sensor 23 is provided to monitor the connection between tractor 1 and implement 2 which is described in detail later.

Contact means 20a, 20b are directly connected to the DC network 25 via branch 9 and power switch 15b. In case of unintentional operating conditions of the electric network, power switch 15b can cut the connection to contact means 20a, 20b to avoid damage to the tractor 1, implement 2, or, operator.

Contact means 19a, 19b, 18c are not connected to the DC/AC branch. Instead they are connected to the control unit 11 as shown by the dotted lines.

AC outlet terminal 17 comprises contact means 17a, 17b, 17c, 17d, 17e. DC outlet terminal 18 comprises contact means 18a, 18b, 18c, 18d. AC outlet terminal 19 comprises contact means 19a, 19b, 19c, 19d, 19e. DC outlet terminal 20 comprises contact means 20a, 20b. Each contact means can be connected to corresponding implement contact means associated with the implement 2 (not shown). The vehicle contact means and the implement contact means may be well-known connectors comprising a male or female part (each provided with a housing and mating contact means) and which are connectable to each other. The contact means thus transfer electrical energy and signals.

DC outlet terminal 20 comprises a temperature sensor 23 to notify the operator whether an connection between the vehicle contact means and the corresponding implement contact means is provided.

In accordance with the invention different arrangements to determine the wear or damage associated with the contact means will now be described.

In FIG. 1, the implement 2 has two consumers 21a, 21b which may be motors or linear drives (AC or DC). Vehicle contact means 18a, 18b, 19c, 19d, 19e are connected to the consumers 21a, 21b by corresponding implement contact means. The remaining contact means 17a, 17b, 17c, 17d, 17e are not connected in this example. Contact means 19a, 19b, 18c, 18d are used in accordance with the invention to notify the operator whether the vehicle contact means is worn or damaged.

In a first arrangement of the invention which determines the operating condition and any wear or damage of the contact means, the consumer comprises a loop of wire 22 across its contact means.

By operating condition it is meant whether the contact means are connected or not connected. A contact means is said to be connected when current, or a signal can be conducted through it and not connected, that is disconnected when a current or signal cannot be conducted through it.

When the implement contact means is connected to the tractor as shown in FIG. 1 the loop of wire 22 connects contact means 18c and 18d, while contact means 18a, 18b power the implement. The wire loop 22 forms a closed circuit with control unit 11 and the control unit 11 can therefore detect if the implement contact means is connected and can send a signal to the tractor cab, to indicate to the operator that the implement is connected. The vehicle contact means wear and can be damaged during use when they are connected and disconnected to different implements. The control unit 11 can count the number of times contact means 18c and 18d are connected, that is the number of times the contact means are re-connected after being disconnected and when a ore-determined number of connections has been reached, the operator can be alerted that the contact means in the respective terminal have worn and need further inspection or replacement. The pre-determined number of connections can be entered into the control unit by the operator. Such wire loops 22 may also be provided in medium voltage networks to disengage the electric supply when contact means are disengaged to avoid electric shocks injuring the operator, or to prevent shock to the operator if the contact means are accidentally touched.

In FIG. 1 consumer 21b is connected to contact means 19a to 19e to show another arrangement for detecting if the vehicle contact means are worn or damaged. Contact means 19a and 19b are connected to a CAN controller 24 associated with the consumer 21b. When connected the control unit 11 sends a CAN message to the consumer 21b, for example, to identify the implement, or receive information about its power requirements. If there is a connection, the CAN controller 24 sends a message back to the control unit 11 and the operator can then see the information he requires. If no message is received, then the connection to the implement may have failed. The control unit 11 can use the CAN controller 24 to count the number of times the vehicle contact means are connected and after a set amount of times can notify the operator. Similar to the method described using the loop of wire 22, the CAN loop can also be used to count the number of connections and warn the operator to inspect the vehicle contact means for wear when a pre-determined number is reached. The contact means to provide CAN loop is shown in FIG. 1 by two vehicle contact means 19a and 19b. Bus systems may require more vehicle contact means, for example four contact means.

In FIG. 1, each terminal 17, 18, 19 and 20 is provided with its own means to detect wear and damage of the connection as each terminal is connected with its separate connector system. If, for example terminals 17 and 18 are integrated within one connector system, the means to detect wear and damage of the contact means must only be provided once.

The described arrangements determine the wear of the vehicle contact means by counting the number of times a contact means is connected which is detected by the control unit 11 of the tractor. This may be adequate in most of the applications of the invention as most known contact means have a part (male or female) which is designed to wear earlier or damage easier. Therefore, efforts and costs for replacement connector parts are reduced.

Typically, various implements are connected to one vehicle, so the wear of the vehicle contact means is not equal to the wear of the implement contact means. However, there are times when the implement is used with different vehicles and if this is the case, the implement contact means may wear quicker than the vehicle contact means and the operator needs to be alerted if the implement contact means are worn. In the previous arrangements described only the overall number of connections of the vehicle contact means is counted.

If the implement is connected via an electronic BUS system, such as ISOBUS, FIELDBUS, ETHERNET which can be identified by the control unit of the tractor, the control unit of the tractor can operate parallel measurements for counting connections of the implement contact means as well as vehicle contact means. Alternatively, the operator can identify the implement and enter its identification reference into the control unit of the tractor to initiate separate measurements of both sets of contact means. Modern tractors are provided with electronic storage means to save and restore settings for the PTO, hydraulic circuits etc, which are related to different implements. A further method therefore of counting the number of connections of both the implement and vehicle contact means is to choose a setting to initiate a separate count related to the implement.

Yet a further arrangement for counting the number of times the implement contact means are re-connected is for the implement to have its own control unit to record the number of connections. This information can then be forwarded to the control unit of the tractor via a BUS system to generate a message for the operator. Alternatively, if provided, an implement display system mounted in the tractor cab may generate the message.

Yet a further alternative arrangement is for the various vehicles to which the implement is connected to send a signal to the implement when it is connected. The control unit of the implement can then count the overall number of connections and forward it to the vehicle control unit for display.

The methods described using the loop of wire and the CAN loop cannot be used to determine the quality of the contact means, that is the amount of wear or damage of the contact means.

An arrangement to monitor the amount of wear or damage of the contact means is to measure their temperature of the contact means. An increase in temperature indicates that the resistance of a contact means has increased. FIG. 1 shows a temperature sensor 23 inside terminal 20 which is connected to control unit 11 and which measures the temperature of the contact means 20a and 20b. Their temperature is compared to a defined, acceptable temperature. If the temperatures of either of these contact means increase, the control unit sends a message to the operator that the contact means in terminal 20 may be worn, or damaged.

Alternatively, the temperature sensor 23 could be replaced by a device or system which measures the resistance of the contact means.

If the implement is provided with its own control unit, it can be connected to the vehicle control unit by a BUS application which allows the vehicle control unit to identify the implement connected. The implement contact means could be provided with a temperature sensor or resistance measurement means as described for the vehicle contact means so that wear and/or damage of the implement contact means can be notified to the vehicle operator.

Yet a further alternative arrangement of measuring the wear or damage of the contact means is to connect the insulation monitor 14 to control unit 11 as shown by the dotted line. The monitor 14 compares the amount of current applied to the vehicle contact means via respective contact means 17c, 17d, 17e, 18a, 18b, 19c, 19d, 19e, 20a, 20b to the actual current flowing across the connection means. If there is a substantial current loss compared to the ground, the resistance of the supply lines is sizeable and therefore the vehicle contact means may be worn or damaged. For example, a value greater than 0.5 Ohms may indicate wear, or damage. The monitor 14 then sends a message to the control unit 11 which warns the operator.

Furthermore, measuring resistance (via a respective sensor or via insulation monitor 14) indicates whether the contact means is connected or not. If the resistance tends to infinity, the contact means is not connected.

In the described arrangements, the vehicle and/or the implement contact means provide medium voltage requiring special measures to avoid malfunction of the connection. It is envisaged that connections with lower voltages may also be equipped according to the present invention to ensure proper operation. Furthermore, connecting means for signals may be provided as described above to determine the quality of connection means, for example, a BUS system or system requiring high quality signal transfer (to forward analogue signals of high accuracy sensors).

As shown in FIG. 1, the means to detect wear and damage of the connection is applicable for AC and DC connections independent of whether AC and DC are provided in parallel, or simply either AC or DC.

The invention claimed is:

1. An electrical connection arrangement on a vehicle comprising vehicle contact means connectable to an implement contact means associated with an implement, wherein said vehicle and/or implement contact means is connectable to a control unit which determines wear or damage of the vehicle and/or implement contact means and the wear or damage is communicated to the vehicle operator, characterised in that the control unit counts and displays the number of times the vehicle and/or implement contact means is re-connected.

2. An electrical connection arrangement as claimed in claim 1 wherein the control unit is installed on the vehicle.

3. An electrical connection arrangement as claimed in claim 2 wherein the vehicle contact means is connectable to an electronic Bus system of an implement and the control unit is sent a signal if the implement is connected.

4. An electrical connection arrangement as claimed in claim 1 wherein the control unit is installed on the implement.

5. An electrical connection arrangement as claimed in claim 1 wherein the control unit notifies the operator of wear or damage when a pre-determined number of re-connections is reached.

6. An electrical connection arrangement as claimed in claim 1 wherein control unit indicates whether the vehicle and/or implement contact means is connected or not.

7. An electrical connection arrangement as claimed in claim 1 wherein the vehicle or implement contact means and the control unit form an open circuit when an implement contact means is disconnected and a closed circuit with the implement contact means is connected.

8. An electrical connection arrangement as claimed in claim 7 wherein the control unit measures the resistance of the circuits and determines whether the vehicle contact means is connected or not.

9. An electrical connection arrangement as claimed in claim 1 wherein the control unit is connected to a temperature sensor which senses the temperature of the vehicle and/or implement contact means allowing the control unit to determine the resistance across the corresponding contact means and therefore whether that contact means is connected or not.

10. An electrical connection arrangement as claimed in claim 1 wherein the control unit is connected to an insulation monitor which compares a current applied to the vehicle contact means to the actual current flowing across the contact means and therefore determines whether an implement is attached to the vehicle contact means or not.

11. An electrical connection arrangement as claimed in claim 1 wherein wear or damage of the vehicle and/or implement means is determined by measuring the temperature or resistance of the vehicle and/or implement contact means.

12. An electrical connection arrangement according to claim 11 wherein the temperature or resistance of the implement contact means is measured and sent to an implement control unit and the implement control unit is connected to the vehicle control unit which notifies the operator of wear/and or damage of the implement contact means.

* * * * *